(12) United States Patent
Groen et al.

(10) Patent No.: US 6,683,502 B1
(45) Date of Patent: Jan. 27, 2004

(54) PROCESS COMPENSATED PHASE LOCKED LOOP

(75) Inventors: Eric D. Groen, Ankeny, IA (US); Charles W. Boecker, Ames, IA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/097,689

(22) Filed: Mar. 12, 2002

(51) Int. Cl.$^7$ .................................................. H03L 7/00
(52) U.S. Cl. ............................................ 331/17; 331/16
(58) Field of Search ........................... 331/1 A, 17, 25, 331/15, 16; 327/156, 157, 159, 147, 148, 150

(56) References Cited

U.S. PATENT DOCUMENTS

| | | | | |
|---|---|---|---|---|
| 3,882,412 A | * | 5/1975 | Apple, Jr. .................... 331/1 A |
| 4,494,080 A | * | 1/1985 | Call ............................... 331/8 |
| 4,570,130 A | * | 2/1986 | Grindel et al. ................ 331/8 |
| 5,382,922 A | * | 1/1995 | Gersbach et al. ........... 331/1 A |
| 5,696,468 A | * | 12/1997 | Nise ............................. 331/14 |
| 5,831,486 A | * | 11/1998 | Wehbi ......................... 331/57 |
| 5,952,892 A | * | 9/1999 | Szajda ......................... 331/57 |
| 5,955,928 A | * | 9/1999 | Smith et al. .................. 331/2 |
| 6,466,100 B2 | * | 10/2002 | Mullgrav et al. ........... 331/179 |

* cited by examiner

Primary Examiner—Tuan T. Lam
(74) Attorney, Agent, or Firm—Edward Mao; Bever Hoffman & Harms (57) ABSTRACT

A phase locked loop having a voltage-controlled oscillator is adjusted to compensate for process variations in the formation of the phase locked loop. In each instance of the phase locked loop, the center frequency of the voltage-controlled oscillator is adjusted using a bias signal while holding the control voltage of the voltage-controlled oscillator at zero. Then, the control voltage of the voltage-controlled oscillator is set to a different value and the gain of the voltage-controlled oscillator is adjusted.

18 Claims, 8 Drawing Sheets

PROCESS COMPENSATED PHASE LOCKED LOOP

FIELD OF THE INVENTION

The present invention relates to clocking circuits for digital systems. More specifically, the present invention relates to a clocking circuit using a process compensated phase locked loop.

BACKGROUND OF THE INVENTION

Clock signals are used for a variety of purpose in digital circuits on both board level systems and integrated circuit (IC) devices, such as transceivers, field programmable gate arrays (FPGAs) and microprocessors. For example, in transceivers, clock signals are used to clock out data bits. Clock signals are typically generated using a phase locked loop (PLL).

Figure 1:
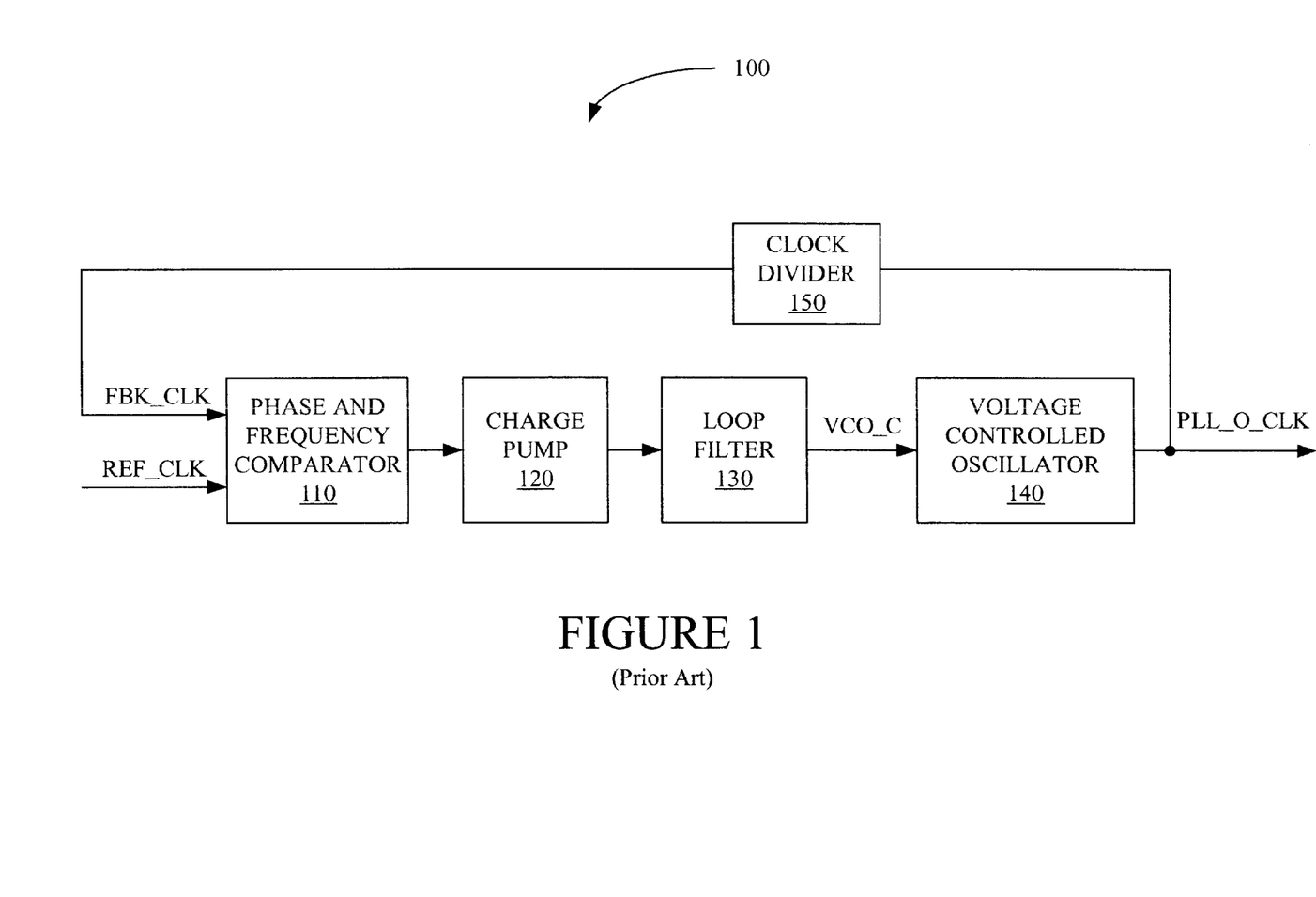
FIG. 1 is a block diagram of a conventional phase locked loop.

FIG. 1 shows a conventional phase locked loop 100 used to generate a PLL output clock signal PLL_O_CLK. Phase locked loop 100 receives a reference clock signal REF_CLK having a frequency F_REF and generates a PLL output clock signal PLL_O_CLK having a frequency F_OUT, where F_OUT is equal to frequency F_REF multiplied by a multiplier, i.e. F_OUT =F_REF*M. Phase locked loop 100 comprises a phase and frequency comparator 110, a charge pump 120, a loop filter 130, a voltage-controlled oscillator (VCO) 140, and a clock divider 150. Clock divider 150 divides PLL output clock signal PL_O_CLK to generate a feedback clock signal FBK_CLK having a frequency F_FBK equal to frequency F_OUT divided by M.

Phase and frequency comparator 110 compares the phase and frequency of feedback clock FBK_CLK to the phase and frequency of reference clock signal REF_CLK. Specifically, if an active edge of feedback clock signal FBK_CLK leads an active edge of reference clock signal REF_CLK, frequency comparator 110 causes charge pump 120 to decrease the voltage level of VCO control signal VCO_C, which is coupled to voltage-controlled oscillator 140 through loop filter 130, to reduce frequency F_OUT of PLL output clock signal PLL_O_CLK, which is generated by voltage-controlled oscillator 140. Conversely, if an active edge of feedback clock signal FBK_CLK is lags an active edge of reference clock signal REF_CLK, frequency comparator 110 causes charge pump 120 to increase the voltage level of VCO control signal VCO_C to increase frequency F_OUT of PLL output clock signal PLL_O_CLK. Thus, eventually, the phase and frequency of feedback clock signal FBK_CLK is nearly equal to the phase and frequency of reference clock signal REF_CLK. As explained above, frequency F_FBK of feedback clock signal FBK_CLK is approximately equal to frequency F_OUT of PLL output clock signal PLL_O_CLK divided by M, i.e., F_FBK= F_OUT/M. Thus, frequency F_OUT of PLL output clock signal PLL_O_CLK is equal to frequency F_REF of reference clock signal REF_CLK multiplied by M, i.e., F_OUT=F_REF*M. Generally, PLL output clock signal PLL_O_CLK would be provided to a clock buffer (not shown) and then distributed to the other components of the chip or system.

Figure 2:
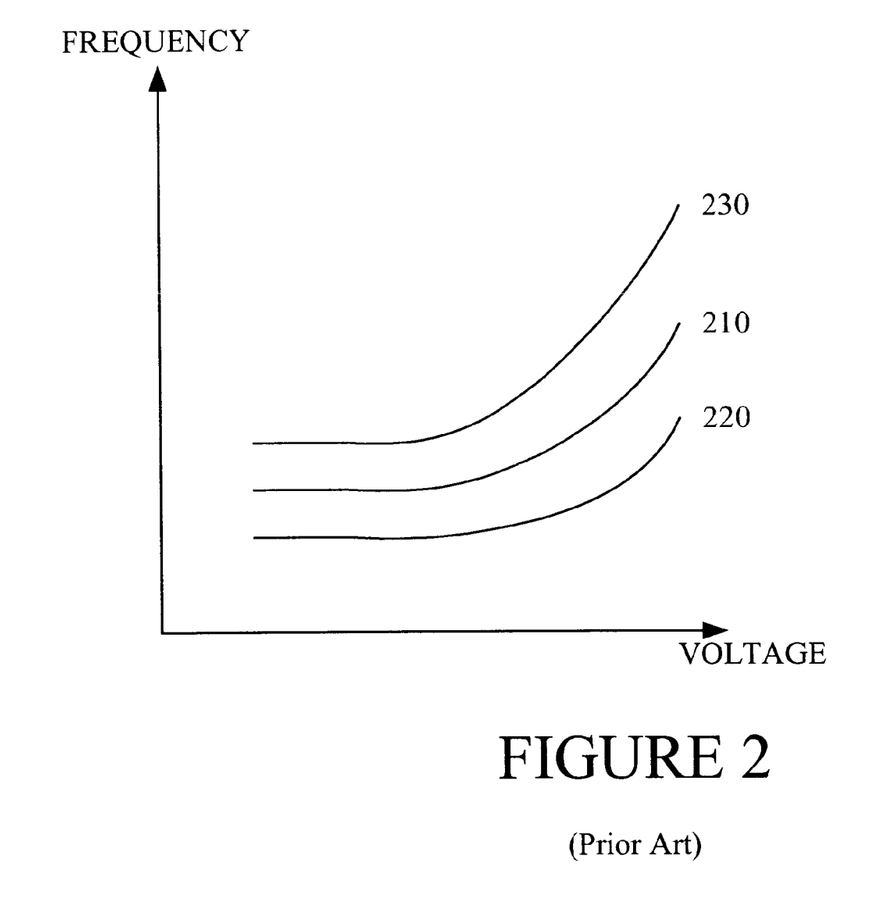
FIG. 2 is a graph of the frequency response of a voltage-controlled oscillator.

As explained above, phase locked loop 100 converges on the desired phase and frequency for PLL output clock signal PLL_O_CLK by controlling voltage-controlled oscillator 140. Thus, voltage-controlled oscillator 140 must operate in a range of frequencies around the desired phase and frequency for PLL output clock signal PLL_O_CLK to compensate for such factors as operating temperature and voltage levels. However, other variable factors such as circuit frequencies and gain characteristic are dependent on process variations during the formation of phase locked loop 100. These process dependent variable factors further increases the necessary range of operation of voltage-controlled oscillator 140. FIG. 2 illustrates frequency voltage curves for voltage-controlled oscillator 140. Specifically, FIG. 2 includes a typical frequency voltage curve 210, a slow frequency voltage curve 220, and a fast frequency voltage curve 230. Typical frequency voltage curve 210 represents the typical frequency voltage response of voltage-controlled oscillator 140. Slow frequency voltage curve 220 represents the theoretical slowest frequency response of voltage-controlled oscillator 140 based on process variations. Conversely, fast frequency voltage curve 230 represents the fastest frequency response of voltage-controlled oscillator 140 based on process variations. Because each instance of voltage-controlled oscillator 140 can have a different frequency response, voltage-controlled oscillator 140 must be designed to perform over the entire range of frequencies and voltages bounded by slow frequency voltage curve 210 and fast frequency voltage curve 230. However, supporting such a wide range of frequency responses complicates the design and increases the cost of voltage-controlled oscillator 140. Hence, there is a need for a method or system to reduce the process dependence of phase locked loops.

SUMMARY

Accordingly, process dependencies of phase locked loops are eliminated using the principles of the present invention. Specifically, each instance of the phase locked loop is adjusted so that the frequency voltage curve of the phase locked loop is very similar to the typical frequency voltage curve.

In accordance with one embodiment of the present invention, a phase lock loop includes a phase and frequency comparator, a charge pump, a voltage controlled oscillator, a clock divider, and a PLL process variation compensation unit. The PLL process variation compensation unit is configured to control the center frequency and the gain of the voltage controlled oscillator. Specifically, the PLL process variation compensation unit includes a center frequency control circuit and a gain control circuit.

The PLL process variation unit performs a two stage process to remove process dependency of the phase locked loop. First, the center frequency of the voltage controlled oscillator is adjusted using a biasing signal. Specifically, the control voltage of the voltage-controlled oscillator is set to zero and the divisor of the clock divider is set to a first value. Then, the bias signal is adjusted until the frequency of a feedback clock signal is approximately equal to the frequency of a reference clock signal. In the second stage, the gain of the voltage-controlled oscillator is adjusted. Specifically, the control voltage is set to a band gap reference voltage and the divisor of the clock divider is set to a second value. Then, the gain of voltage-controlled oscillator is adjusted until the frequency of the feedback clock signal is approximately equal to the frequency of the reference clock signal.

The present invention will be more fully understood in view of the following description and drawings.

DETAILED DESCRIPTION

As explained above, the performance of conventional phase locked loops suffers from process variations. The present invention minimizes the process dependence of phase locked loops by adjusting frequency response of each instance voltage controlled oscillator to have a typical frequency voltage curve. Specifically, the center frequency and gain of the voltage-controlled oscillator are adjusted to compensate for the process variations.

Figure 3:
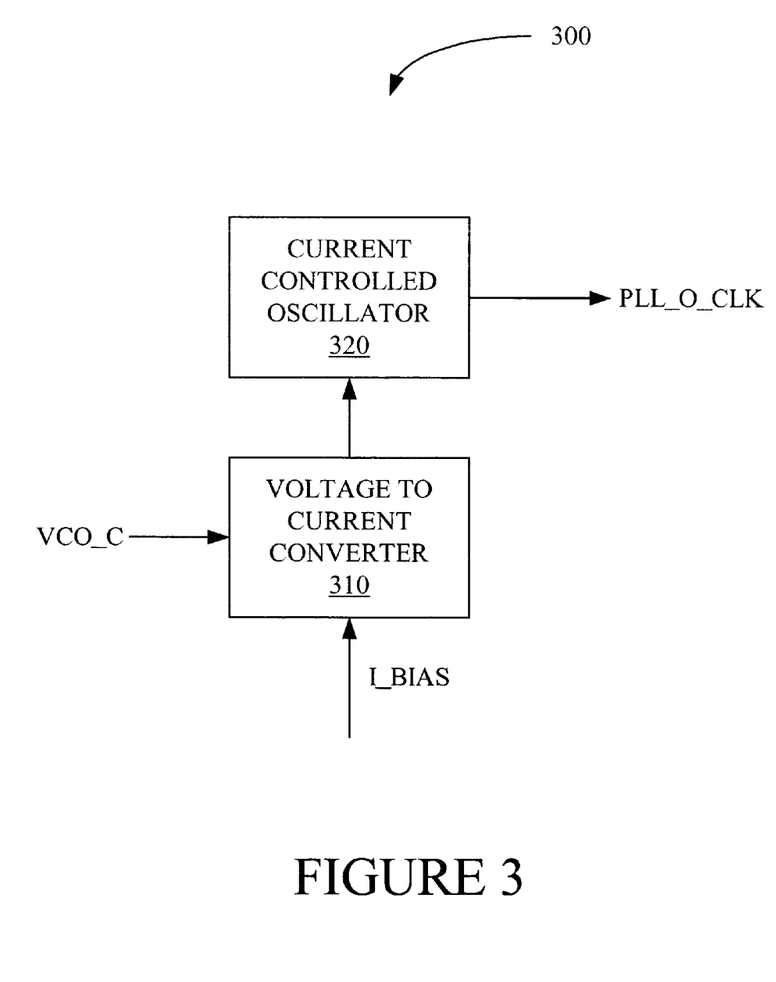
FIG. 3 is block diagram of a voltage-controlled oscillator.

FIG. 3 illustrates a voltage-controlled oscillator 300 formed using a voltage to current converter 310 and a current controlled oscillator 320 as used in some embodiments of the present invention. VCO control voltage VCO_C from loop filter 130 (FIG. 1) is converted into a control current I_CTRL for current controlled oscillator 320, which generates PLL output clock signal PLL_O_CLK as described above. A bias current I_BIAS is used to control the center frequency of voltage-controlled oscillator 300. Other embodiments of the present invention use other forms of voltage-controlled oscillators. For clarity, the principles of the invention are described using voltage-controlled oscillator 300. One skilled in the art can adapt the principles of the present invention for use with other voltage-controlled oscillators.

Figure 4:
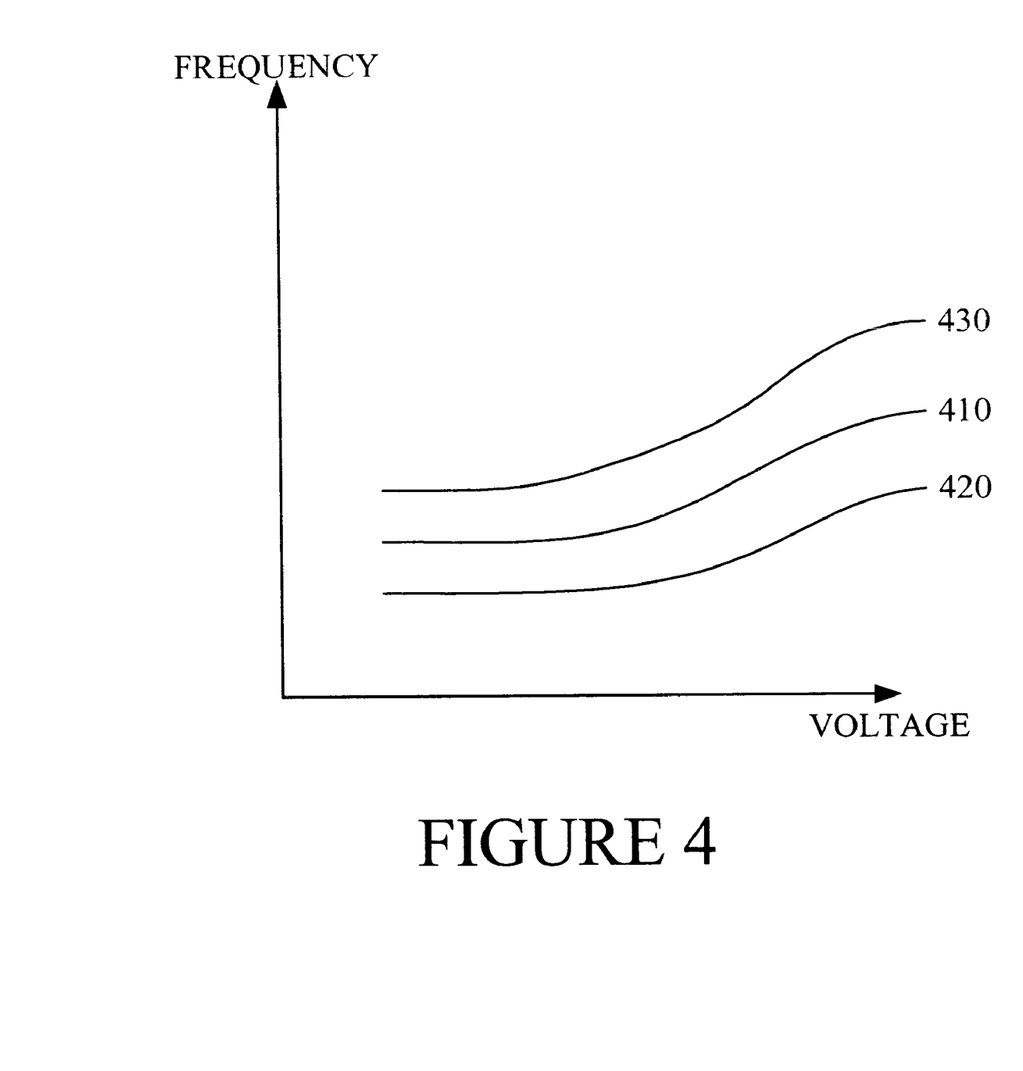
FIG. 4 is a graph of the frequency response of a voltage-controlled oscillator.

With respect to voltage-controlled oscillator 300, the frequency voltage curves of FIG. 2 represent the performance using a single-ended voltage to current converter and having bias current I_BIAS fixed at specific level. FIG. 4 illustrates frequency voltage curves for voltage-controlled oscillator 300 using a differential voltage to current converter with a fixed bias current. Specifically, FIG. 4 includes a typical frequency voltage curve 410, a slow frequency voltage curve 420, and a fast frequency voltage curve 430. As illustrated in FIG. 4, using a differential voltage to current converter results in "flatter" frequency voltage curves. However, using a differential voltage to current converter by itself does not significantly reduce the range of frequencies due to process variations.

In accordance with one embodiment of the present invention, the spread between the fast frequency voltage curve and the slow frequency voltage curve can be narrowed by building the voltage-controlled oscillators with an adjustable center frequency. The center frequency of a voltage-controlled oscillator is the frequency of the voltage-controlled oscillator with a zero control voltage. The center frequency of voltage-controlled oscillator 300 can be adjusted by adjusting bias current I_bias to compensate for process variation.

Figure 5:
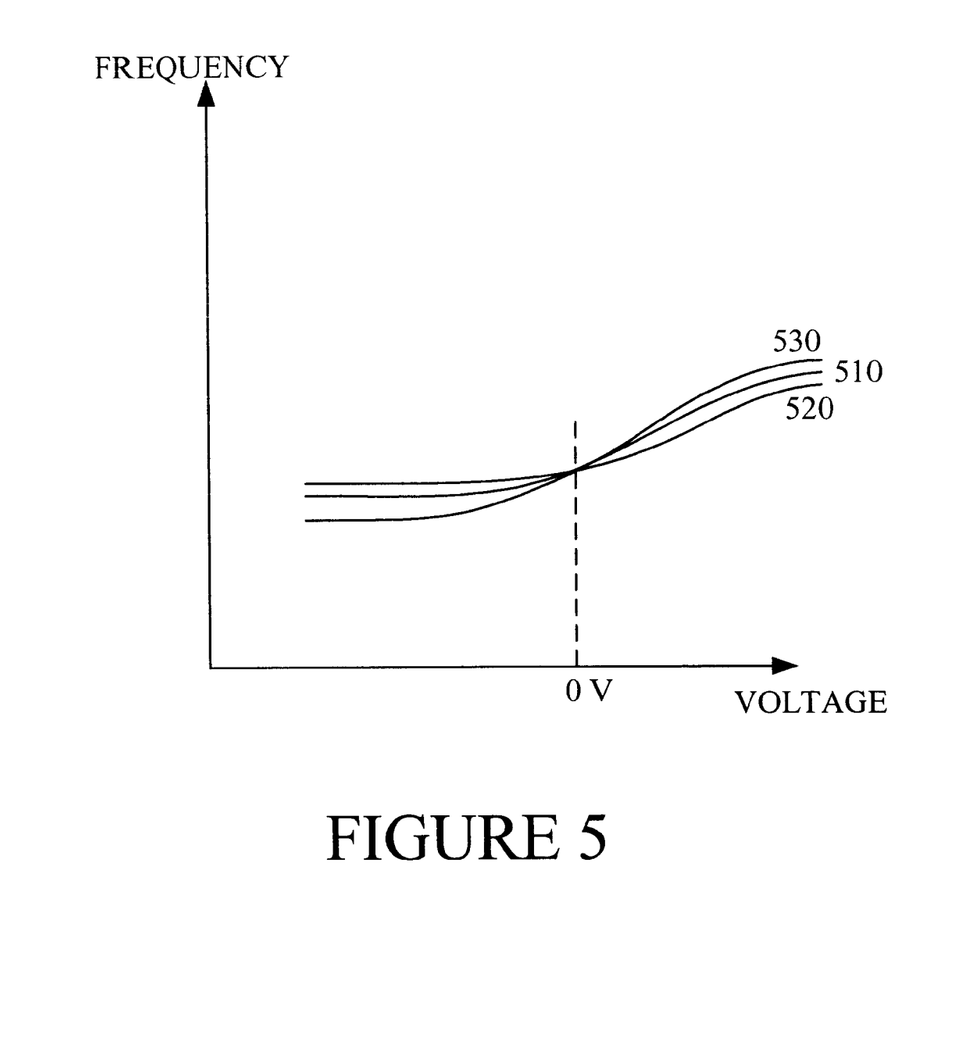
FIG. 5 is a graph of the frequency response of a voltage-controlled oscillator.

FIG. 5 illustrates the adjusted frequency voltage curves for voltage-controlled oscillator 300. Specifically, FIG. 5 includes a typical frequency voltage curve 510, a slow frequency voltage curve 520, and a fast frequency voltage curve 530, all of which have been adjusted to have the same center frequency. As illustrated in FIG. 5, adjusting the center frequency does reduce the spread between fast frequency voltage curve 530 and slow frequency voltage curve 510 but does not completely compensate for process variations away from the center frequency.

By adjusting the slope of the frequency voltage curve of each particular instance of the voltage-controlled oscillator, the voltage frequency response of that instance can be adjusted to be same as the typical frequency voltage curve. Thus, the spread between fast frequency voltage curve and the slow frequency voltage curve caused by process variations can be eliminated. Thus, embodiments of the present invention also include circuitry to adjust the slope of the frequency voltage curves. The slope of the frequency voltage curve is directly related to the gain (hereinafter referred to as gain K_VCO) of the voltage-controlled oscillator. Specifically, the frequency of voltage-controlled oscillator is equal to the center frequency plus K_VCO multiplied by the control voltage. Thus, in some embodiments of the present invention, phase locked loops include a VCO gain control circuit to adjust the gain of the voltage-controlled oscillators. Any of a number of well known techniques can be used to build a VCO gain control circuit to adjust the gain of the voltage controlled oscillator.

For voltage-controlled oscillator 300, gain K_VCO is equivalent to the transconductance (i.e., gm) of voltage to current converter 320 multiplied by a gain K_ICO of current controlled oscillator 310. Thus, a VCO gain control circuit for voltage-controlled oscillator 300 can control the transconductance of voltage to current converter 320, gain K_ICO of current controlled oscillator 310, or both the transconductance of voltage to current converter 320 and gain K_ICO of current controlled oscillator 310.

Several well known techniques can be used to control the transconductance of a voltage to current converter. For example, in one embodiment of the present invention voltage to current converter 310 is constructed using an input stage and an output stage. The input stage is a differential pair. The transconductance is controlled by having multiple input devices that can be configured to be on or off. Switches can be put in series in the differential pair to enable differing number of devices. By using 4 switches that enable 1, 2, 4, and 8 devices, respectively a relative range for transconductance from 0 to 15 can be created. Alternatively, a similar technique can be used in the output stage, which is generally a current mirror. Specifically, 1, 2, 4, or 8 devices could be switched in as the output device of the current mirror.

Figure 6:
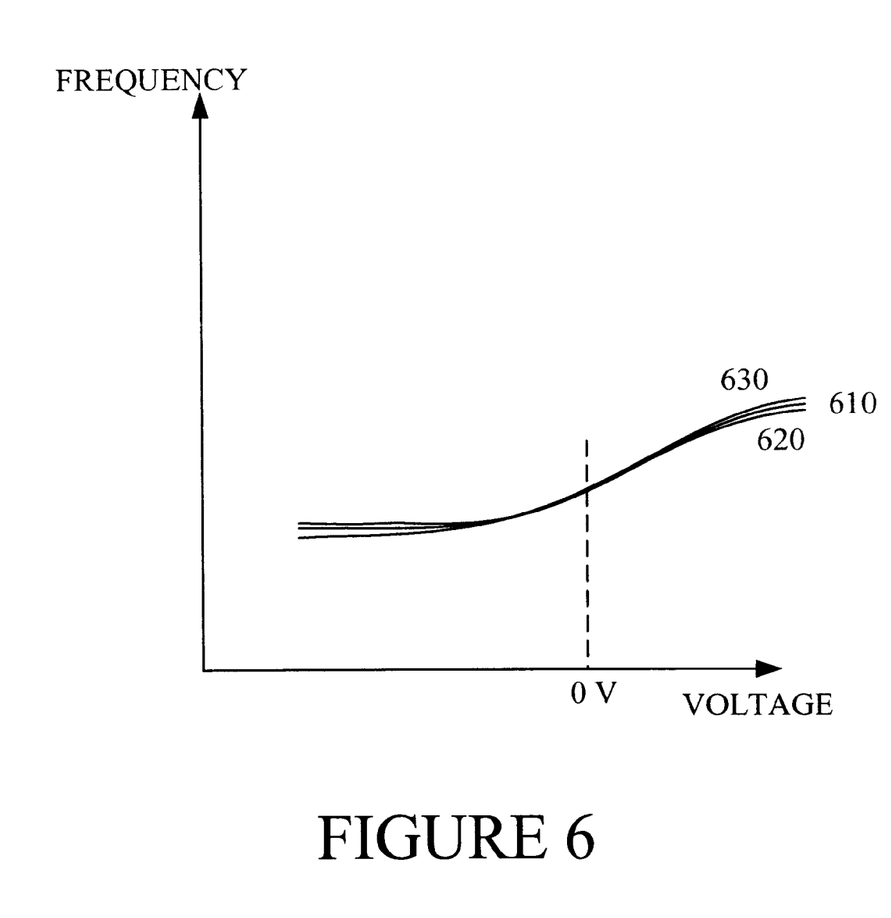
FIG. 6 is a graph of the frequency response of a voltage-controlled oscillator.

FIG. 6 illustrates frequency voltage curves for voltage-controlled oscillator 300 after adjusting both the center frequency and the gain of voltage-controlled oscillator 300 to eliminate the problems caused by process variations. Specifically, FIG. 6 includes a typical frequency voltage curve 610, a slow frequency voltage curve 620, and a fast frequency voltage curve 630. As illustrated in FIG. 6, by controlling both the center frequency and the gain a voltage-controlled oscillator the range of frequencies due to process variations can be eliminated near the center frequency of the voltage-controlled oscillator.

Figure 7:
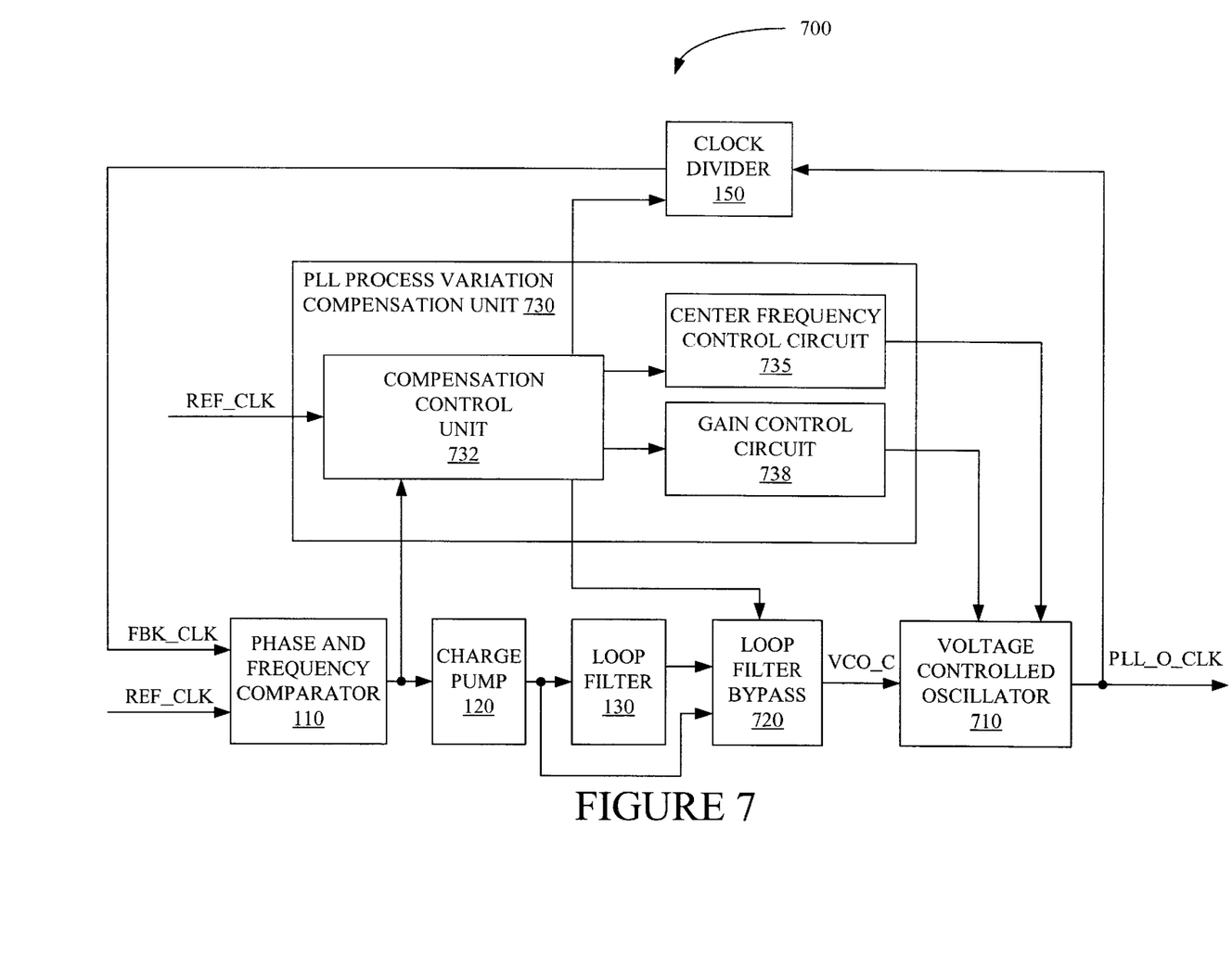
FIG. 7 is a block diagram of a phase locked loop in accordance with one embodiment of the present invention.

FIG. 7 is a block diagram of a phase locked loop 700 in accordance with one embodiment of the present invention. Because phase locked loop 700 is similar to phase locked loop 100 (FIG. 1) the description of unchanged elements is not repeated. In phase locked loop 700, voltage-controlled oscillator 140 is replaced with a configurable voltage-controlled oscillator 710. In addition, phase locked loop 700 includes a loop filter bypass 720 and a PLL process variation compensation unit 730 having a compensation control unit 732, a center frequency control circuit 735 and a gain control circuit 738. Compensation control unit 732 receives the control signals from phase and frequency comparator 110 and drives control signals to clock divider 150, center frequency control circuit 735, gain control circuit 738, and loop filter bypass 720 as described below. As shown in FIG. 7, some embodiments of compensation control unit 732 use reference clock signal REF_CLK for timing. Center frequency control circuit 735 adjusts the center frequency of voltage-controlled oscillator 710. Specifically, compensation control unit 732 would control loop filter bypass 720 to drive VCO control signal VCO_C to zero volts. Then center frequency control circuit adjusts the center frequency of voltage-controlled oscillator 710, so that reference clock signal REF_CLK and feedback clock signal FBK_CLK have the same frequency. As explained above, if voltage-controlled oscillator 710 is similar to voltage-controlled oscillator 300 (FIG. 3), the center frequency can be adjusted by adjusting bias current I_BIAS. Gain control circuit 738 adjusts the gain (K_VCO) of voltage-controlled oscillator 710 under the control of compensation control unit 732. In general the center frequency of voltage-controlled oscillator 710 is adjusted prior to adjusting the gain. Then, as explained in more details below, VCO control signal VCO_C is set to a band gap reference and the divider value of clock divider 150 is set to a new value. Then, gain control circuit 738 adjusts the gain in voltage-controlled oscillator 710 so that the frequency of feedback clock FBK_CLK and reference clock REF_CLK are equal.

Figure 8:
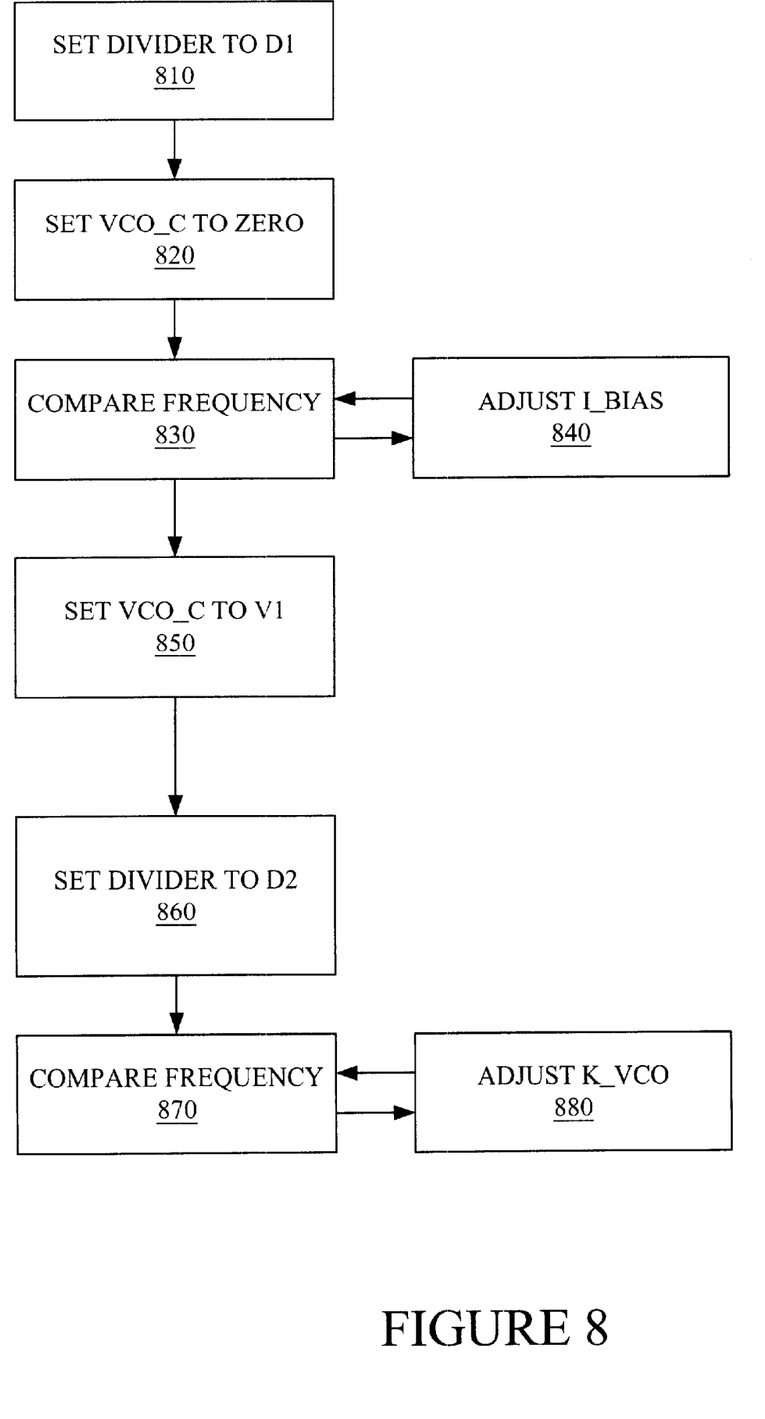
FIG. 8 is a process flow diagram in accordance with one embodiment of the present invention.

FIG. 8 is a process flow diagram 800 for an embodiment of the present invention to eliminate process variations in a particular instance of a phase locked loop. For clarity, process flow diagram 800 is described with respect to phase locked loop 700 (FIG. 7). However one skilled in the art can adapt the principles of the present invention to other phase locked loops. In set divider to D1 stage 810, the divider value of clock divider 150 is set to a first divider value D1. Divider value D1 can be any non-zero positive integer. D1 should be selected so that the phase locked loop is operating within the range operating range. For example, in one embodiment of the present invention divider value D1 is 10 and the desired operating range is 4 to 6 gigahertz. Then, in set VCO_C to zero stage 810, VCO control voltage VCO_C of voltage-controlled oscillator 710 is set to zero.

In compare frequency stage 830, the frequency of reference clock signal REF_CLK and feedback clock signal FBK_CLK are compared. If the frequency of reference clock signal REF_CLK is less than the frequency of feedback clock signal FBK_CLK then bias current I_BIAS is decreased in adjust I_BIAS stage 840. Conversely, if the frequency of reference clock signal REF_CLK is greater than the frequency of feedback clock signal FBK_CLK then bias current I_BIAS is increased in adjust I_BIAS stage 840. After adjusting bias current I_BIAS in adjust I_BIAS stage 840, the frequency of reference clock signal REF_CLK and feed back clock signal FBK_CLK are again compared in compare frequency stage 830. When the frequency of reference clock signal REF_CLK and feed back clock signal FBK_CLK are equal center frequency adjustment is complete.

Gain adjustments begins by setting VCO control signal VCO_C to a voltage level V1 in set VCO_C to V1 stage 850. Voltage level V1 is a constant band gap reference. Then, the divider value of clock divider 150 is set to a second divider value D2 in set divider to D2 stage 860. Divider value D2 can be any non-zero positive integer. Divider value D2 should be close to divider value D1. Generally, D1 and D2 should be within 20% of each other. In addition D1 and D2 should be selected so that the frequency of PLL output clock signal PLL_O_CLK is within the desired operating range. For example, in one embodiment of the present invention where divider value D1 is 10, divider value D2 is equal to 12. In compare frequency stage 870, the frequency of reference clock signal REF_CLK and feedback clock signal FBK_CLK are compared. If the frequency of reference clock signal REF_CLK is less than the frequency of feedback clock signal FBK_CLK then gain K_VCO of the voltage controlled oscillator is decreased in adjust K_VCO stage 880. Conversely, if the frequency of reference clock signal REF_CLK is greater than the frequency of feedback clock signal FBK_CLK then gain K_VCO is increased in adjust K_VCO stage 880. After adjusting gain K_VCO in adjust K_VCO stage 880, the frequency of reference clock signal REF_CLK and feed back clock signal FBK_CLK are again compared in compare frequency stage 870. When the frequency of reference clock signal REF_CLK and feed back clock signal FBK_CLK are equal, the phase locked loop is configured to have a typical frequency response. Thus, the variable frequency response caused by process variations is essentially eliminated.

Rather than searching up and down for the proper bias current I_BIAS in adjust I_BIAS stage 840, some embodiments of the present invention use a simple unidirectional search. Specifically, one embodiment of the present invention starts with the minimum value of bias current I_BIAS and then adjusts bias current I_BIAS upwards using the smallest incremental change possible until the frequency of feedback clock signal FBK_CLK is greater than or equal to the frequency of .reference clock signal REF_CLK. Similarly, the proper value for gain K_VCO can be found using the same technique. Other embodiments of the present invention may use faster search techniques such as a binary search.

In the various embodiments of this invention, novel structures and methods have been described to compensate for process variations in a phase locked loop. Specifically, the effects of process variations is reduced or eliminated by adjusting the center frequency and gain of the voltage controlled oscillator to compensate for the process variations. The various embodiments of the structures and methods of this invention that are described above are illustrative only of the principles of this invention and are not intended to limit the scope of the invention to the particular embodiments described. For example, in view of this disclosure, those skilled in the art can define other phase locked loops, voltage-controlled oscillators, PLL process variation compensation units, compensation control units, center frequency control circuits, gain control circuits, loop filter bypasses, phase and frequency comparators, charge pumps, and so forth, and use these alternative features to create a method or system according to the principles of this invention. Thus, the invention is limited only by the following claims.

What is claimed is:

1. A phase locked loop configured to receive a reference signal and to generate a PLL output clock signal, the phase locked loop comprising:

a phase and frequency comparator coupled to receive the reference clock signal and a feedback clock signal;

a charge pump coupled to the phase and frequency comparator;

a voltage controlled oscillator coupled to the charge pump and coupled to generate the PLL output clock signal;

a clock divider coupled to the voltage controlled oscillator and the phase and frequency comparator; and a PLL process variation compensation unit coupled to control a center frequency and a gain of the voltage controlled oscillator, wherein the PLL process variation compensation unit is operably configured to control the center frequency by:

setting a divisor of the clock divider to a first value; and adjusting a bias signal of a voltage to current converter until frequency of the feedback clock signal is approximately equal to frequency of the reference clock signal.

2. The phase locked loop of claim 1, further comprising a loop filter coupled between the voltage controlled oscillator and the charge pump.

3. The phase locked loop of claim 2, further comprising a loop filter bypass coupled between the voltage controlled oscillator and the loop filter.

4. The phase locked loop of claim 1, wherein the PLL process variations compensation unit further comprises:

a center frequency control circuit coupled to control the center frequency of the voltage controlled oscillator; and a gain control circuit coupled to control the gain of the voltage controlled oscillator.

5. The phase locked loop of claim 4, wherein the PLL process variations compensation unit further comprises a compensation control unit coupled to the center frequency control circuit, the gain control circuit and the phase and frequency comparator.

6. The phase locked loop of claim 4, wherein the gain control circuit controls a transconductance value in the voltage controlled oscillator.

7. A method for compensating for process variations in a phase locked loop having a phase and frequency comparator, a charge pump, a voltage controlled oscillator and a clock divider, the method comprising:

adjusting a center frequency of the voltage controlled oscillator by:
setting a divisor of the clock divider to a first value; and
adjusting a bias signal of a voltage to current converter of the voltage controlled oscillator until frequency of a feedback clock signal is approximately equal to frequency of a reference clock signal; and adjusting a gain of the voltage controlled oscillator.

8. The method of claim 7, wherein the adjusting a center frequency of the voltage controlled oscillator comprises:

setting a control voltage of the voltage controlled oscillator to zero prior to adjusting the bias signal.

9. The method of claim 8, wherein the adjusting the bias signal of the voltage controlled oscillator until the frequency of the feedback clock signal is approximately equal to the frequency of the reference clock signal comprises:

setting the bias signal to an initial value;

comparing the frequency of the reference clock signal with the frequency of the feedback clock signal; and incrementing the bias signal when the frequency of the feedback clock signal is less than the frequency of the reference clock signal.

10. The method of claim 7, wherein the adjusting a gain of the voltage controlled oscillator comprises:

setting the gain of the voltage controlled oscillator to an initial value;

comparing the frequency of the reference clock signal with the frequency of the feedback clock signal; and incrementing the gain of the voltage controlled oscillator when the frequency of the feedback clock signal is less than the frequency of the reference clock signal.

11. The method of claim 10, wherein the adjusting a gain of the voltage controlled oscillator further comprises setting a divisor of the clock divider to a second value.

12. The method of claim 10, wherein the incrementing the gain of the voltage controlled oscillator when the frequency of the feedback clock signal is less than the frequency of the reference clock signal comprises increasing a transconductance of a voltage to current converter in the voltage controlled oscillator.

13. A system for compensating for process variations in a phase locked loop having a phase and frequency comparator, a charge pump, a voltage controlled oscillator and a clock divider, the method comprising:

means for adjusting a center frequency of the voltage controlled oscillator by:
setting a divisor of the clock divider to a first value; and
adjusting a bias signal of a voltage to current converter of the voltage controlled oscillator until frequency of a feedback clock signal is approximately equal to frequency of a reference clock signal; and means for adjusting a gain of the voltage controlled oscillator.

14. The system of claim 13, wherein the means for adjusting a center frequency of the voltage controlled oscillator comprises:

means for setting a control voltage of the voltage controlled oscillator to zero prior to the adjusting of the bias signal.

15. The system of claim 14, wherein the means for adjusting the bias signal of the voltage controlled oscillator until the frequency of the feedback clock signal is approximately equal to the frequency of the reference clock signal comprises:

means for setting the bias signal to an initial value;

means for comparing the frequency of the reference clock signal with the frequency of the feedback clock signal; and means for incrementing the bias signal when the frequency of the feedback clock signal is less than the frequency of the reference clock signal.

16. The system of claim 13, wherein the means for adjusting a gain of the voltage controlled oscillator comprises:

means for setting the gain of the voltage controlled oscillator to an initial value;

means for comparing the frequency of the reference clock signal with the frequency of the feedback clock signal; and means for incrementing the gain of the voltage controlled oscillator when the frequency of the feedback clock signal is less than the frequency of the reference clock signal.

17. The system of claim 16, wherein the means for adjusting a gain of the voltage controlled oscillator further comprises means for setting a divisor of the clock divider to a second value.

18. The system of claim 16, wherein the means for incrementing the gain of the voltage controlled oscillator when the frequency of the feedback clock signal is less than the frequency of the reference clock signal comprises means for increasing a transconductance of a voltage to current converter in the voltage controlled oscillator.

* * * * *